US 6,417,922 B1

(12) United States Patent
Dirksen et al.

(10) Patent No.: US 6,417,922 B1
(45) Date of Patent: *Jul. 9, 2002

(54) ALIGNMENT DEVICE AND LITHOGRAPHIC APPARATUS COMPRISING SUCH A DEVICE

(75) Inventors: Peter Dirksen, Valkenswaard; Antonius M. Nuijs, Eindhoven, both of (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 09/324,421

(22) Filed: Jun. 1, 1999

Related U.S. Application Data

(63) Continuation-in-part of application No. 09/099,505, filed on Jun. 18, 1998.

(30) Foreign Application Priority Data

Dec. 29, 1997 (EP) .............................. 97204127

(51) Int. Cl.⁷ ............................................. G01B 11/00
(52) U.S. Cl. ...................... 356/401; 356/400; 250/548
(58) Field of Search ................................ 356/401, 400; 250/548, 559.3; 355/53

(56) References Cited

U.S. PATENT DOCUMENTS

| 4,251,160 A | 2/1981 | Bouwhuis et al. .......... 356/401 |
| 4,356,392 A | 10/1982 | Wittekoek et al. .......... 250/201 |
| 4,737,823 A | 4/1988 | Bouwer et al. ................ 355/53 |
| 4,778,275 A | 10/1988 | Van Den Brink et al. .. 356/401 |
| 5,026,166 A | 6/1991 | Van Der Werf ............. 356/401 |
| 5,100,237 A | 3/1992 | Wittekoek et al. .......... 356/401 |
| 5,191,200 A | 3/1993 | Van Der Werf et al. . 250/201.4 |
| 6,160,622 A | * 12/2000 | Dirksen et al. ............. 356/401 |

FOREIGN PATENT DOCUMENTS

| EP | WO 0498499 B1 | 8/1997 | ............. G03F/7/20 |
| JP | 6340316 A | 2/1988 | ........... H01L/21/30 |
| WO | WO 97/32241 | 9/1997 | |
| WO | WO 97/35234 | 9/1997 | |
| WO | 9835234 | 9/1997 | ............. G03F/9/00 |

* cited by examiner

Primary Examiner—Frank G. Font
Assistant Examiner—Andrew H. Lee
(74) Attorney, Agent, or Firm—Pillsbury Winthrop LLP

(57) ABSTRACT

An alignment device, for use in a lithographic apparatus, for aligning a first object, provided with a first alignment mark relative to a second object, provided with a second alignment mark, employs as a radiation source a laser which emits an alignment beam having a wavelength which is of the order of 1000 nm and to the order of 1100 nm.

17 Claims, 7 Drawing Sheets

ALIGNMENT DEVICE AND LITHOGRAPHIC APPARATUS COMPRISING SUCH A DEVICE

This is a continuation-in-part of application Ser. No. 09/099,505, filed Jun. 18, 1998.

BACKGROUND OF THE INVENTION

The invention relates to an alignment device for aligning a first object, which is provided with at least a first alignment mark, with respect to a second object which is provided with at least a second alignment mark, said device comprising a radiation source for supplying at least an alignment beam, a first object holder, a second object holder, an imaging system for imaging said first alignment mark and said second alignment mark onto each other, and a radiation-sensitive detection system arranged in the path of selected alignment beam portions coming from a first alignment mark and a second alignment mark onto which the first alignment mark is imaged, the output signal of the detection system being indicative of the extent to which the first and the second object are aligned with respect to each other.

The invention also relates to a lithographic apparatus for repetitively imaging a mask pattern on a substrate, in which apparatus such an alignment device for aligning a mask with respect to a substrate is used. The mask has at least a mask alignment mark and the substrate has at least a substrate alignment mark.

Aligning, for example, a mask alignment mark and a substrate alignment mark with respect to each other is understood to mean both directly and indirectly aligning these alignment marks. In the case of direct alignment, a substrate alignment mark is imaged on a mask alignment mark, or conversely, and the detection system is arranged behind the last mark. In the case of indirect alignment, both the substrate alignment mark and the mask alignment mark are imaged on different parts of a further, reference, mark, and the detection system is arranged behind the reference mark. In the latter case, the extent to which the substrate alignment mark and the mask alignment mark are aligned with respect to each other is determined by detecting to what extent both the substrate alignment mark and the mask alignment mark are aligned with respect to the reference mark.

The selected alignment beam portions are those portions of the alignment beam which are effectively used to image the first alignment mark on the second alignment mark. If the alignment marks are diffraction gratings, the selected alignment beam portions are the beam portions diffracted in given orders, for example the first orders, by the alignment marks.

U.S. Pat. No. 4,778,275 describes an optical lithographic projection apparatus for repetitive and reduced imaging of a mask pattern, for example, the pattern of an integrated circuit (IC) on a number of IC areas, or substrate fields, of the substrate. The mask and the substrate are moved with respect to each other between two successive illuminations, for example, along two mutually perpendicular directions in a plane parallel to the substrate plane and the mask plane so as to successively image the mask pattern in all substrate fields.

Integrated circuits are manufactured by means of diffusion and masking techniques. A number of different mask patterns are consecutively imaged on one and the same location on a semiconductor substrate. Between the consecutive imaging steps on the same locations, the substrate must undergo the desired physical and chemical changes. To this end, the substrate must be removed from the apparatus after it has been illuminated with a first mask pattern and, after it has undergone the desired process steps, it must be placed in the apparatus again in the same position so as to illuminate it with a second mask pattern, and so forth. It must then be ensured that the projections of the second mask pattern and of the subsequent mask patterns are positioned accurately with respect to the substrate.

The lithographic techniques can also be used in the manufacture of other structures having detail dimensions of the order of micrometers or less, such as structures of integrated planar optical systems, magnetic heads, or structures of liquid crystalline display panels. Also in the manufacture of these structures, images of the mask pattern must be aligned very accurately with respect to a substrate.

In order to be able to realize the desired, great positioning accuracy, within several tenths of one micrometer in the apparatus according to U.S. Pat. No. 4,778,275, of the projection of the mask pattern with respect to the substrate, this apparatus comprises a device for aligning the substrate with respect to the mask pattern with which an alignment mark provided in the substrate is imaged on an alignment mark provided in the mask. If the image of the substrate alignment mark accurately coincides with the mask alignment mark, the substrate is correctly aligned with respect to the mask pattern. In the known alignment device, a HeNe laser beam is used as an alignment beam.

In connection with the increasing number of electronic components per IC and the resultant smaller dimensions of these components, increasingly stricter requirements are imposed on the accuracy with which ICs can be manufactured. This means that a mask pattern must be aligned with respect to the substrate fields with an increasing accuracy.

The alignment device described in U.S. Pat. No. 4,778,275 has hitherto worked to full satisfaction, but it is to be expected that with decreasing detail sizes, or line widths, of the IC patterns and with the use of novel technologies in IC manufacture, the alignment device may present problems relating to its reliability and accuracy. These problems relate to the symmetry of an alignment mark, required for alignment, and the symmetry of the processes to which the substrate, hence also the substrate alignment mark, is subjected. The known alignment device is only reliable if both the alignment mark and the processes are symmetrical.

In the manufacture of new-generation ICs with smaller line widths, the resolving power of the projection lens system used for the mask pattern projection must be increased, which means that the numerical aperture of this system must be increased. This means that the depth of focus of this system decreases. Since there will be some curvature of the image field at the desired relatively large image field of the projection lens system, there is substantially no tolerance for the evenness of the substrate. To maintain the desired evenness of the substrate, it may be polished, in between to illuminations of the substrate, by means of the chemical mechanical polishing (CMP) process. This polishing process is found to cause an asymmetrical distortion in a substrate alignment mark implemented as a grating. Besides the CMP process, the manufacture of ICs has also become more and more complex by the use of non-uniform etching processes and the provision of an increasing number of metal layers on the substrate. This also leads to an asymmetrical distortion of the substrate alignment mark. Moreover, these substrates, and hence the alignment marks, are coated with a number of transparent layers, such as oxide layers, nitride layers and poly layers. These layers may be deposited isotropically, but they may cause interference effects in the alignment beam affecting the alignment. Particularly the combination of asymmetry in the alignment mark and interference effects may give rise to relatively large alignment errors.

SUMMARY OF THE INVENTION

It is an object of the present invention to provide an alignment device in which the above-mentioned problems do not occur and which is more accurate and more reliable than the known devices. This alignment device is characterized in that the wavelength of the alignment beam is of the order of at least 1000 nm and at most 1100 nm.

The invention is based on the recognition that, taking into account the relevant parameters of the period of the grating mark, the chosen diffraction orders, the profile of the mark including the asymmetrical shape and the depth, the deposited dielectric layers and metal layers and the standard deviation of the alignment error, a more accurate and reliable alignment error detection is possible as the wavelength of the alignment beam is larger. The upper limit for this wavelength is limited by the material of the substrate; for a wavelength of more than 1100 nm, silicon becomes transparent to the alignment beam and its rear side is visible to the alignment device. The standard deviation is the deviation which results from a variation of the parameter: layer thickness or depth of the mark. The fact that a choice has been made for this standard deviation means that the criterion is not the average value of zero but that the position of the substrate alignment mark, observed by the device, must be constant. The requirement is that the observed position of the mark remains constant, for example, at varying layer thicknesses, even if the mark is asymmetrical and is independent of the thickness of the radiation-sensitive layer on the substrate, or the layer packet deposited on the mark.

It is to be noted that the English-language abstract of JP-A 63-40316 states that interferences in the radiation-sensitive layer result in an arbitrary variation of the intensity of the reflected alignment beam, so that the diffraction pattern becomes indefinite. However, in this abstract it is proposed to vary the wavelength of the read beam. This solution has the same drawback as the alternative solution of using a broadband alignment beam, namely the elements of the alignment device must be made suitable for broadband radiation, which complicates this device to a considerable extent. Moreover, a weak detection signal would then be obtained and no order diaphragm for selecting suitable diffraction orders could be placed in the alignment beam.

A preferred embodiment of the alignment device is further characterized in that the radiation source is constituted by one of the following lasers:

an Nd:YAG laser having a wavelength of 1064 nm;
an Nd:YLF laser having a wavelength of 1047 nm;
a semiconductor laser having a wavelength of 980 nm.

These lasers are already manufactured in large numbers for other applications and are very suitable for use in the novel alignment device.

The alignment device may be further characterized in that the detection system comprises an InGaAs detector.

This detector has the desired sensitivity to said wavelengths.

It is also possible to use a Si-detector.

The invention also relates to a lithographic apparatus for imaging a mask pattern on a substrate, which apparatus comprises an illumination unit for illuminating a mask with a projection beam, a mask holder, a substrate holder, and a projection system arranged between the mask holder and the substrate holder, and further comprises a device for aligning the mask and the substrate with respect to each other. This apparatus is characterized in that the alignment device is constituted by the alignment device described hereinbefore, wherein the substrate and the mask constitute the first and the second object for the alignment device.

The most customary embodiment of this apparatus is further characterized in that the projection beam is a beam of electromagnetic radiation, and the projection system is an optical projection system, and in that the imaging system of the alignment device also comprises the optical projection lens system.

However, the projection beam may also be a charged-particle beam such as an ion beam, an electron beam or a beam of X-ray radiation, for which the projection system is adapted to the type of radiation. For example, if the projection beam is an electron beam, the projection system will be an electron lens system. This projection system then no longer forms part of the imaging system of the alignment device.

At the above-mentioned wavelengths for the alignment beam, imaging errors, namely a magnification error and a focusing error, are produced when using the projection system for imaging a first alignment mark on a second alignment mark. The reason is that the projection system is optimized for the short-wave projection radiation, for example deep UV radiation. The difference between the wavelengths of the projection radiation and that of the alignment radiation is now even larger than in known apparatuses, in which the alignment radiation has a wavelength of 633 nm.

To prevent these imaging errors, the apparatus according to the invention is further characterized in that a correction element for correcting the direction and convergence of the alignment beam portion reflected by an alignment mark is arranged between the substrate holder and the mask holder, said correction element having a dimension which is considerably smaller than the diameter of the projection beam in the plane of the correction element.

The principle of using such a correction element in an alignment device is described in U.S. Pat. No. 5,100,237. This patent also gives details about the position of the correction element, and some embodiments of this element are mentioned. In an alignment device with the proposed wavelength for the alignment beam, the correction element is even more needed than in the apparatus described in U.S. Pat. No. 5,100,237.

These and other aspects of the invention are apparent from and will be elucidated with reference to the embodiments described hereinafter.

DETAILED DESCRIPTION OF THE INVENTION

Figure 1:
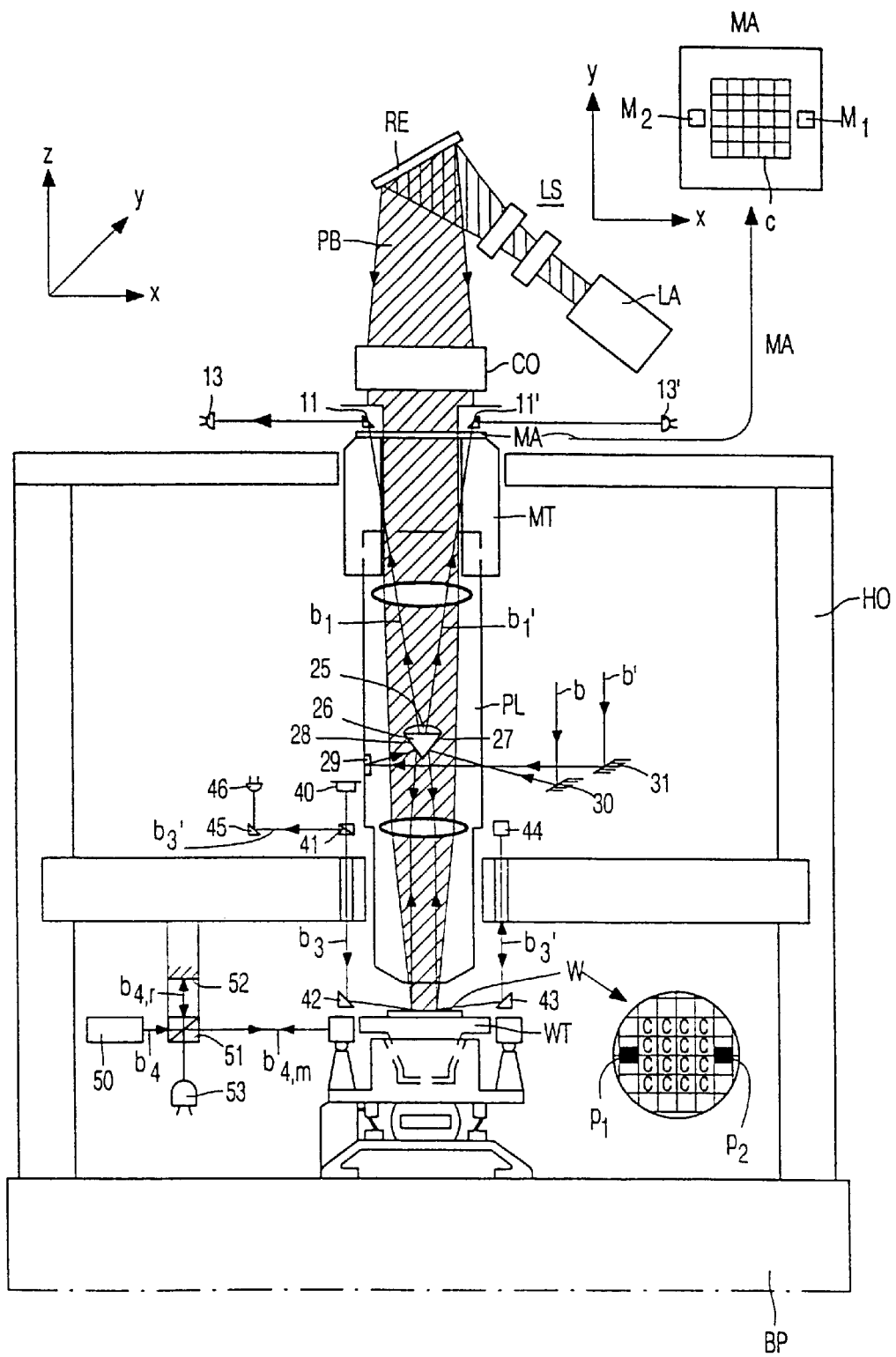
FIG. 1 shows an embodiment of a lithographic apparatus for repetitively imaging a mask pattern on a substrate.

The invention will now be described in greater detail with reference to the figures of the drawing.

FIG. 1 shows the principle and an embodiment of a lithographic apparatus for repetitively imaging a mask pattern on a substrate. The main components of this apparatus are a projection column, in which a mask MA provided with the mask pattern C to be imaged is arranged, and a movable substrate table WT with which the substrate W can be positioned with respect to the mask pattern. The apparatus further comprises an illumination unit which consists of a radiation source LA, for example a Krypton-Fluoride laser, a lens system LS, a reflector RE and a condensor lens CO. The projection beam PB supplied by the illumination unit illuminates the mask pattern C present in the mask MA which is arranged on a mask holder (not shown) in the mask table MT.

The projection beam PB passing through the mask pattern C traverses a projection lens system PL arranged in the projection column and shown only diagrammatically, which system forms an image of the pattern C each time in one of the many IC areas, or substrate fields, of the substrate W. The projection lens system has, for example a magnification M of ¼, a numerical aperture of the order of 0.5 and a diffraction-limited image field with a diameter of the order of 0.25. These numbers are arbitrary and may vary with every new generation of the projection apparatus. The substrate W is arranged in a substrate holder (not shown) which forms part of a substrate table WT supported in, for example, air bearings. The projection lens system PL and the substrate table WT are arranged in a housing HO which is closed at its lower side by a base plate BP of, for example granite, and at its upper side by the mask table MT.

As is shown in the top-right-hand corner of FIG. 1, the mask MA has two alignment marks $M_1$ and $M_2$. These marks preferably consist of diffraction gratings, but they may be alternatively formed by other periodical structures. The alignment marks are preferably two-dimensional, i.e. they extend in two mutually perpendicular directions, the X and Y directions in FIG. 1. The substrate W, for example a semiconductor substrate on which the pattern C must be imaged in the different substrate fields, comprises a plurality of alignment marks, preferably also two-dimensional diffraction gratings, two of which, $P_1$ and $P_2$, are shown in FIG. 1. The marks $P_1$ and $P_2$ are located outside the substrate fields where the images of the mask pattern must be formed. The substrate alignment marks $P_1$ and $P_2$ are preferably formed as phase gratings and the mask alignment marks $M_1$ and $M_2$ are preferably formed as amplitude gratings.

Figure 2:
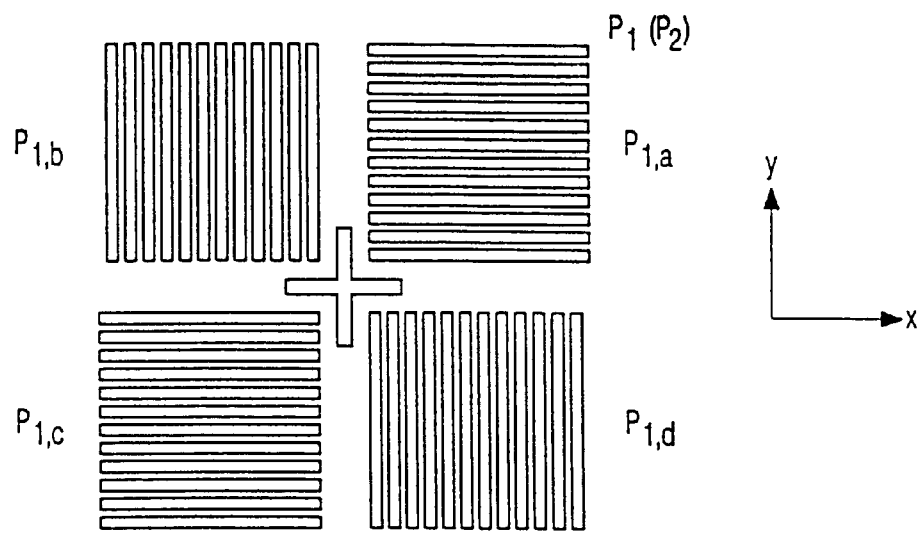
FIG. 2 shows an embodiment of an alignment mark in the form of a two-dimensional grating.

FIG. 2 shows one of the two identical substrate phase gratings on a larger scale. Such a grating may comprise four sub-gratings $P_{1,a}$, $P_{1,b}$, $P_{1,c}$ and $P_{1,d}$, two of which, $P_{1,b}$ and $P_{1,d}$, are used for alignment in the X direction and the two other sub-gratings, $P_{1,a}$ and $P_{1,c}$, are used for alignment in the Y direction. The two sub-gratings $P_{1,b}$ and $P_{1,c}$ have a grating period of, for example, 16 $\mu$m and the sub-gratings $P_{1,a}$ and $P_{1,d}$ have a grating period of, for example, 17.6 $\mu$m. Each sub-grating may cover a surface area of, for example, 200×200 $\mu$m. An alignment accuracy which, in principle, is less than 0.1 $\mu$m can be achieved with these grating marks and a suitable optical system. Different grating periods have been chosen so as to increase the capture range of the alignment device.

FIG. 1 shows a first embodiment of an alignment device, namely a double alignment device in which two alignment beams b and b' are used for aligning the substrate alignment mark $P_2$ on the mask alignment mark $M_2$, and the substrate alignment mark $P_1$ on the mask alignment mark $M_1$. The alignment beam b is reflected to the reflective surface 27 of a prism 26 by means of a reflecting element 30, for example, a mirror. The surface 27 reflects the beam b to the substrate alignment mark $P_2$ which sends a part of the radiation as beam $b_1$ to the associated mask alignment mark $M_2$ where an image of the mark $P_2$ is formed. A reflecting element 11, for example a prism which directs the radiation passed by the mark $M_2$ to a radiation-sensitive detector 13, is arranged above the mark $M_2$.

Figure 3:
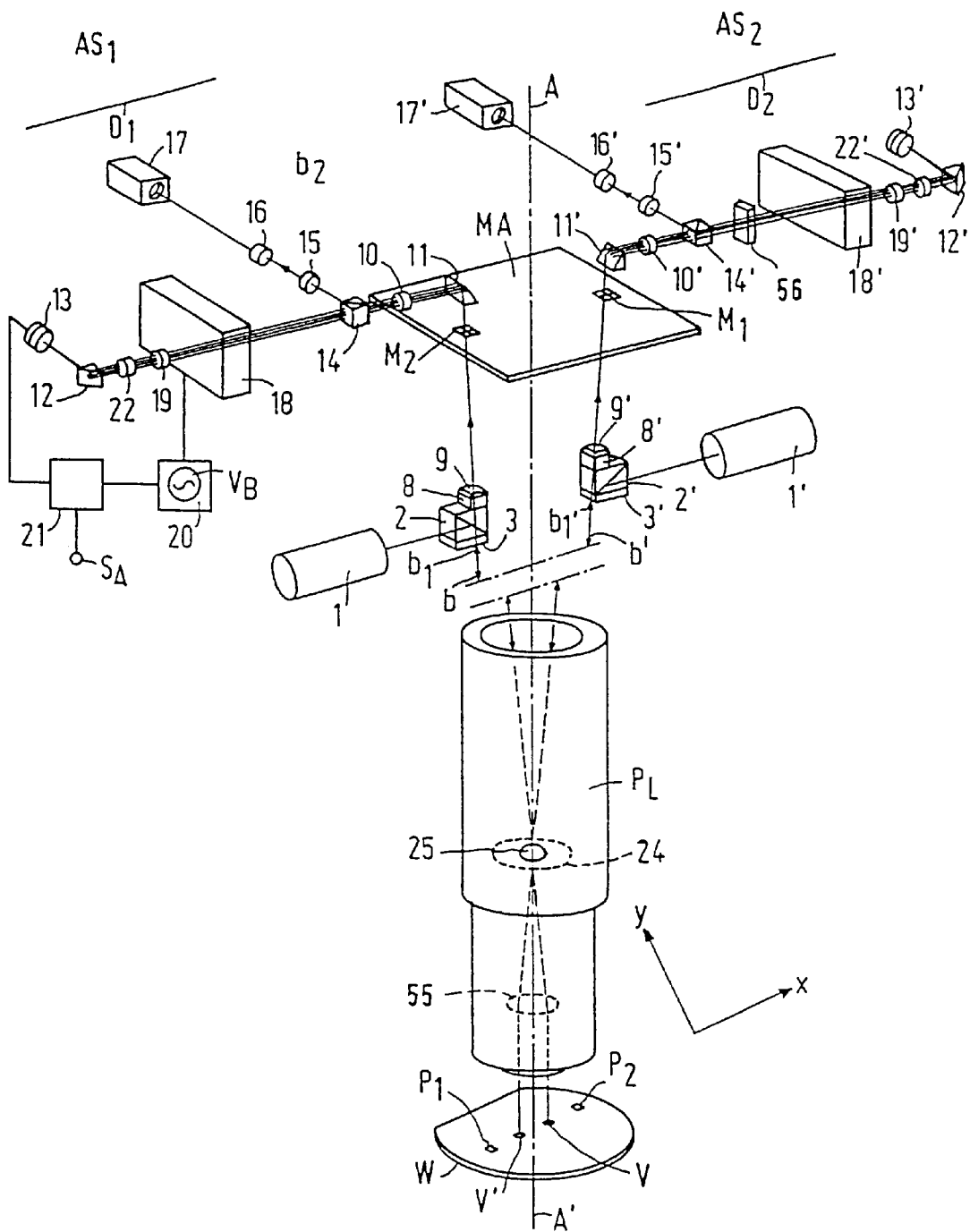
FIG. 3 shows an embodiment of the lithographic apparatus comprising a double alignment device.

The second alignment beam b' is reflected to a reflector 29 in the projection lens system PL by a mirror 31. This reflector sends the beam b' to a second reflecting surface 28 of the prism 26, which surface directs the beam b' onto the substrate alignment mark $P_1$. This mark reflects a part of the radiation of the beam b' as beam $b'_1$ to the mask alignment mark $M_1$ where an image of the mark $P_1$ is formed. The radiation of the beam $b'_1$ passing through the mark $M_1$ is directed towards a radiation-sensitive detector 13' by a reflector 11'. The operation of the double alignment device will be further described with reference to FIG. 3 showing a further embodiment of such a device.

The projection apparatus further comprises a focus error detection system for determining a deviation between the image plane of the projection lens system PL and the surface of the substrate W, so that this deviation can be corrected, for example, by moving the projection lens system with respect to the substrate holder along the optical axis of the projection lens system. The focus error detection system may be constituted by the elements 40, 41, 42, 43, 44, 45 and 46 which are arranged in a holder (not shown) which is fixedly connected to the holder of the projection lens system. Element 40 is a radiation source, for example a diode laser, emitting a focusing beam $b_3$. This beam is directed onto the substrate at a small angle by a reflecting prism 42, while the focusing beam reflected by the substrate is directed towards a retroreflector 44 by the prism. This element reflects the beam in itself, so that the focusing beam once more traverses the same path as beam $b_3'$ via reflection on the prism 43 to the substrate and from this substrate to the prism 42. The reflected focusing beam $b_3'$ then reaches a beam splitter 41 which reflects the beam to a further reflector 45. This reflector sends the focusing beam to a radiation-sensitive detection system 46. This detection system consists of, for example a position-sensitive detector or of two separate detectors. The position of the radiation spot formed by the beam b' on this system is dependent on the extent to which the image plane of the projection lens system coincides with the surface of the substrate W. For an extensive description of the focus error detection system, reference is made to U.S. Pat. No. 4,356,392.

Instead of this focus error detection system with a monochromatic focusing beam, a focus-and-tilt detection system working with a broadband beam is preferably used. Such a broadband detection system is described in U.S. Pat. No. 5,191,200.

In order to determine the X and Y positions of the substrate very accurately, the apparatus comprises a composite interferometer system having a plurality of measuring axes, of which only a one-axis sub-system is shown in FIG. 1. This sub-system comprises a radiation source 50, for example a laser, a beam splitter 51, a stationary reference mirror 52 and a radiation-sensitive detector 53. The beam $b_4$ emitted by the source 50 is split by the beam splitter 51 into a measuring beam $b_{4,m}$ and a reference beam $b_{4,r}$. The measuring beam reaches the measuring mirror in the form of a reflective side face of the substrate table, or preferably a reflective side face of the substrate holder which forms part of the substrate table and on which the substrate is rigidly secured. The measuring beam reflected by the measuring mirror is combined by the beam splitter 51 with the reference beam reflected by the reference mirror 52 so as to form an interference pattern at the location of the detector 53. The composite interferometer system may be implemented as described in U.S. Pat. No. 4,251,160 and then comprises two measuring axes. The interferometer system may alternatively comprise three measuring axes as described in U.S. Pat. No. 4,737,823, but is preferably a system with at least five measuring axes as described in EP-A 0 498 499.

By making use of a substrate position detection device in the form of a composite interferometer system, the positions of, and the mutual distances between, the alignment marks $P_1$ and $P_2$ and the marks $M_1$ and $M_2$ can be fixed during alignment in a system of co-ordinates defined by the interferometer system. Then it is not necessary to refer to a frame of the projection apparatus or to a component of this frame, so that variations in this frame due to, for example temperature variations, mechanical creep and the like do not affect the measurements.

FIG. 3 shows the principle of the double alignment device with reference to an embodiment which is distinguished from that in FIG. 1 by a different manner of coupling the alignment beams b and b' into the projection lens system. The apparatus comprises two separate and identical alignment systems $AS_1$ and $AS_2$ which are positioned symmetrically with respect to the optical axis AA' of the projection lens system PL. The alignment system $AS_1$ is associated with the mask alignment mark $M_2$ and the alignment system $AS_2$ is associated with the mask alignment mark $M_1$. The corresponding elements of the two alignment systems are denoted by the same reference numerals, those of the elements of the system $AS_2$ being distinguished by their primed notation.

The structure of the system $AS_1$ as well as the way in which the mutual position of the mask alignment mark $M_2$ and, for example, the substrate alignment mark $P_2$ is determined will now be described first.

The alignment system $AS_1$ comprises a radiation source 1 which emits an alignment beam b. This beam is reflected towards the substrate by a beam splitter 2. The beam splitter may be a partially transparent reflector or a partially transparent prism, but is preferably a polarization-sensitive splitting prism which is succeeded by a quarter-wavelength plate 3. The projection lens system PL focuses the alignment beam b to a small radiation spot V having a diameter of the order of 1 mm on the substrate W. This substrate reflects a part of the alignment beam as beam $b_1$ in the direction of the mask MA. The beam $b_1$ traverses the projection lens system PL, which system images the radiation spot on the mask. Before the substrate is arranged in the projection column, it has been prealigned in a prealignment station, for example the station described in U.S. Pat. No. 5,026,166, so that the radiation spot V is located on the substrate alignment mark $P_2$. This mark is then imaged by the beam $b_1$ on the mask alignment mark $M_2$. Taking the magnification M of the projection lens system into account, the dimension of the mask alignment mark $M_2$ is adapted to that of the substrate alignment mark $P_2$ so that the image of the mark $P_2$ accurately coincides with the mark $M_2$ if the two marks are mutually positioned in the correct manner.

On its path to and from the substrate W, the alignment beams b and $b_1$ have traversed twice the quarter wavelength plate 3 whose optical axis extends at an angle of 45° to the direction of polarization of the linearly polarized beam b coming from the source 1. The beam passing through the plate 3 then has a direction of polarization which is rotated 90° with respect to that of the beam b, so that the beam $b_1$ is passed by the polarization splitting prism 2. The use of the polarization splitting prism in combination with the quarter-wavelength plate provides the advantage of a minimum radiation loss when coupling the alignment beam into the radiation path of the alignment system.

The beam $b_1$ passed by the alignment mark $M_2$ is reflected by a prism 11 and directed, for example, by a further reflecting prism 12 towards a radiation-sensitive detector 13. This detector is, for example, a composite photodiode having, for example, four separate radiation-sensitive areas in conformity with the number of sub-gratings according to FIG. 2. The output signals of the sub-detectors comprise information about the extent to which the mark $M_2$ coincides with the image of the mark $P_2$. These signals may be processed electronically and used for moving the mask with respect to the substrate by means of driving systems (not shown) so that the image of the substrate alignment mark $P_2$ coincides with the mask alignment mark $M_2$.

A beam splitter 14 splitting a part of the beam $b_1$ as beam $b_2$ may be arranged between the prism 11 and the detector 13. The split beam is then incident via, for example, two lenses 15 and 16 on a television camera which is coupled to a monitor (not shown) on which the alignment marks $P_2$ and $M_2$ are visible to an operator of the apparatus.

Analogously as described above for the alignment marks $P_2$ and $M_2$, the marks $M_1$ and $P_1$, and $M_1$ and $P_2$, respectively, can be aligned with respect to each other. The alignment system $AS_2$ is used for the last-mentioned alignments.

For further details about the alignment procedures by means of the double alignment system, reference is made to U.S. Pat. No. 4,778,275, the contents of which are hereby incorporated by reference.

The alignment marks $P_1$ and $P_2$ in the form of gratings or other diffraction elements split the alignment beams incident thereon into a non-deflected zero-order sub-beam and a plurality of, deflected, first-order and higher-order sub-beams. Of these sub-beams, only those having the same order number are selected in the alignment device so as to image the substrate alignment mark on a mask alignment mark. For the selection of the sub-beams, an order diaphragm is arranged in the projection lens system at a position where the sub-beams diffracted in the different diffraction orders are spatially separated to a sufficient extent, for example, in the Fourier plane of the projection lens system. This order diaphragm is diagrammatically indicated by means of the reference numeral 55 in FIG. 3 and consists of a plate which is non-transmissive to the alignment radiation and has a plurality of radiation-transmissive apertures or areas. If the alignment mark has a two-dimensional grating structure, the plate has four apertures: two for the sub-beams diffracted in the relevant order in the plus and minus X direction and two for the sub-beams diffracted in the plus and minus Y direction. Moreover, an additional order diaphragm improving the selection of the desired order is preferably arranged in the detection branch, i.e. the part of the radiation path from the mask alignment mark to the detector 13, 13'. The sub-beams diffracted in the first orders are preferably used for the alignment.

The alignment device described operates satisfactorily if the substrate alignment mark is symmetrical and the processes to which the substrate, and hence the alignment marks present on the substrate, are subjected are symmetrical processes. Only if these two conditions are met, the position of the axis of symmetry of a substrate alignment mark observed with the alignment device is a constant, and the alignment position remains constant throughout the process steps. However, the lithographic process techniques have become complex in the course of time and are becoming even more complex due to the use of non-uniform etching processes, chemical-mechanical polishing techniques and the deposition of an increasing number of metal layers on the substrate. As a result, material is deposited or removed mainly on one side of a substrate alignment mark, so that this mark becomes asymmetrical. Moreover, the substrate alignment marks are coated with transparent dielectric layers having poorly controlled thicknesses. Although the deposition of the customary oxide, nitride and poly layers is, in principle, isotropic, the interference effects which may occur in these layers in combination with the resultant asymmetry of the marks may cause inadmissibly large alignment errors. If the alignment error is plotted versus the layer thickness in a graph, an oscillation curve is obtained. Upon each change of a layer thickness by $\lambda/4.n$, in which n is the refractive index of the layer, the alignment error changes from a maximum to a minimum. When using alignment radiation at a wavelength of 633 nm (from a HeNe laser), a change of thickness of an oxide layer by 100 nm will occur during a full oscillation period. Since the number of transparent layers increases even more, it will be extremely difficult to limit the layer thickness variation to a fraction of 100 nm.

To reduce the influence of said effects on the alignment signal to a considerable extent, a wavelength of the alignment beam(s) of the order of 1000 nm is chosen in accordance with the invention. To minimize the disturbance of the alignment signal, it has been found that the wavelength of the alignment beam must be-as large as possible. On the other hand, a maximum value is imposed on this wavelength because a silicon substrate becomes transparent, for example, at wavelengths of more than 100 nm. At this wavelength, the alignment device could observe the lower side of the substrate, so that other errors are introduced.

In accordance with the invention, an Nd:YAG laser having a wavelength of 1064 nm is used for the radiation source 1 (1') of the alignment device. Alternatively, an Nd:YLF laser having a wavelength of 1047 nm may be used. A further alternative is the use of a semiconductor diode laser having a wavelength of 980 nm.

Figure 4:
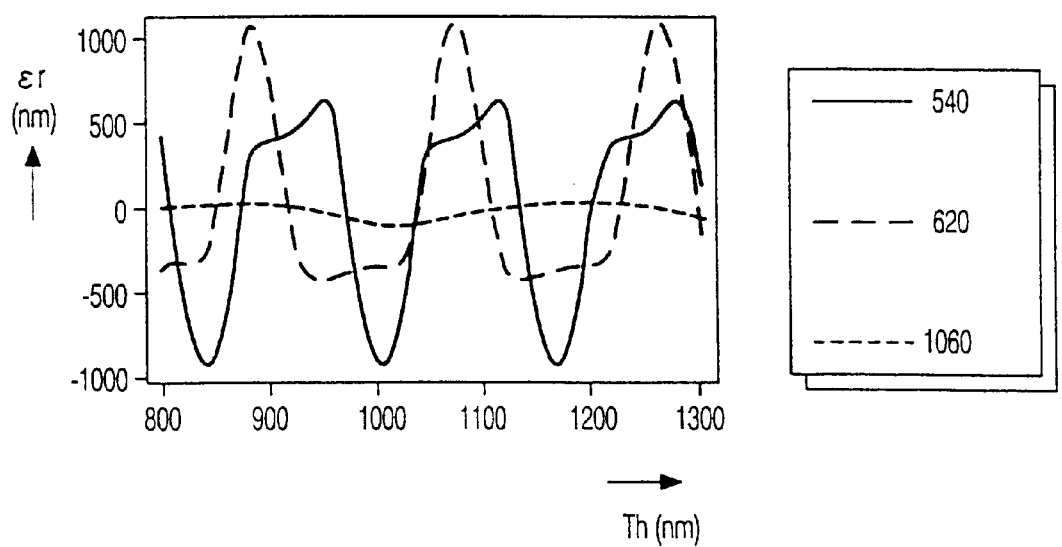
FIG. 4 shows the alignment error as a function of the thickness of a photosensitive layer for the new alignment wavelength and for known alignment wavelengths.

The effect of the choice of a longer wavelength for the alignment radiation is illustrated in FIG. 4. In this Figure, the alignment error Er is shown as a function of the thickness Th of the photosensitive layer on the substrate, at three different wavelengths. It is immediately clear that the alignment error is considerably smaller at the wavelength of 1060 nm than that which occurs when one of the two other wavelengths is used.

In accordance with a further aspect of the invention, the detector 13 (13') of the alignment device is constituted by a semiconductor detector, whose radiation-sensitive element is composed of the materials Indium, Gallium and Arsenic. Such an InGaAs detector has the desired sensitivity to the chosen wavelengths.

Since the projection lens system PL is designed for the wavelength of the projection beam PB which, in connection with the desired large resolving power of the apparatus should be as small as possible, deviations may occur when this system is used for imaging the alignment marks $P_1$, $P_2$ and $M_1$, $M_2$ on each other by means of the alignment beam. For example, the substrate alignment marks will not be imaged in the plane of the mask pattern in which the mask alignment marks are located, but will be imaged in a plane at a given distance therefrom. This distance is determined by the difference between the wavelengths of the projection beam and the alignment beam and by the difference between the refractive indices of the material of the elements of the projection lens system for the two wavelengths. In a known lithographic apparatus, in which the projection beam has a wavelength of, for example 248 nm and the alignment beam has a wavelength of 633 nm, this distance may be up to 2 m. Moreover, due to said wavelength difference, a substrate alignment mark is imaged on a mask alignment mark with a magnification which deviates from the desired magnification. It will be evident that the magnification error and said distance increase at a larger difference between the wavelengths of the projection beam and the alignment beam, and that corrective measures become even more necessary.

A correction, which is preferred because of its simplicity, consists of accommodating a correction lens 25, or another refracting or diffracting element, in the projection lens system, as is shown in FIGS. 1 and 3. The correction lens is arranged at such a height in the projection column that, on the one hand, only the sub-beams with the selected diffraction orders, for example the first orders, coming from the substrate alignment mark are influenced with this lens and, on the other hand, this lens has a negligible influence on the projection beam and the mask pattern image formed thereby.

Figure 5:
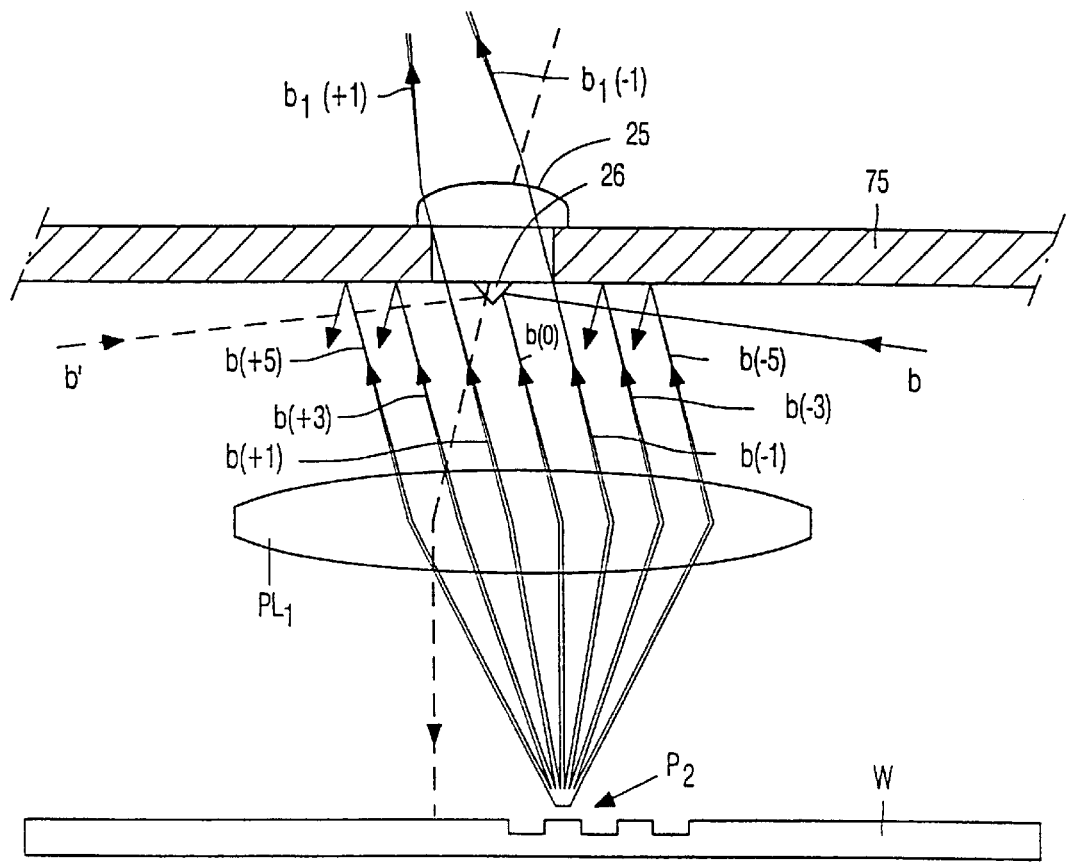
FIG. 5 shows the operation of a correction lens for the alignment radiation.

The effect of the correction lens can be elucidated with respect to FIG. 5 which shows the part of the radiation path between the correction lens and the substrate alignment mark $P_2$. The alignment beam b incident on the diffraction grating $P_2$ is split into a zero-order sub-beam b(0) which, upon perpendicular incidence of the beam b, has the same direction as the alignment beam, two sub-beams b(+1) and b(−1) of the first order and a number of pairs of sub-beams of the third, the fifth, etc. orders. These sub-beams are reflected towards the projection lens system. The first-order sub-beams reach the correction lens 25 located in the plane 24. This lens has such a power that it changes the directions of the first-order sub-beams in such a way that the chief rays of these beams intersect each other in the plane of the mask alignment mark $M_2$. The correction lens has such a small diameter that the higher-order sub-beams do not pass through this lens. A element preventing the zero-order sub-beam from passing through this lens is arranged proximate to the correction lens. In the embodiment of FIG. 5, this element is constituted by the reflecting prism 26 which is used for coupling the alignment beams b and b' into the projection lens system. This prism reflects the zeroorder sub-beam in the direction of the incident alignment beam b. Due to said measures, it is achieved that only the first-order sub-beams are used for imaging the substrate alignment mark on the mask alignment mark, so that some additional advantages can be achieved.

The zero-order sub-beam does not comprise information about the position of the substrate alignment mark. Dependent on the geometry of the grating-shaped mark, notably the depth of the grating grooves and the ratio between the width of these grooves and the width of the grating intermediate strips, this beam may have a considerable intensity as compared with the intensity of the first-order sub-beams. By suppressing the zero-order sub-beam, the contrast in the image of the substrate mark may be enhanced considerably. When using the first-order sub-beams only, the second harmonic of the substrate alignment mark is, as it were, imaged, which means that the image of the mark, apart from the magnification M of the projection lens system, has a period which is half that of the mark itself. If it is ensured that the grating period of the mask alignment mark is equal to that of the image of the substrate alignment mark, i.e. equal to M/2 times the grating period of the substrate alignment mark, the accuracy with which a substrate alignment mark is aligned with respect to a mask alignment mark is twice as large as in the case where the full alignment beam is used for the imaging step.

The correction lens does not only ensure that the selected alignment beam portions are sharply focused on the mask plane, but, in principle, may also correct for an error of the magnification with which a substrate alignment mark is imaged on a mask alignment mark. Since the difference between the wavelengths of the projection beam and the alignment beam is larger than before, an extra lens 9, see FIG. 3, for correcting the residual magnification error is preferably arranged in the path of the alignment beam between the projection lens system PL and the mask alignment mark.

PCT patent application WO 97135234, which relates to a special choice of the diffraction orders of the alignment beam so as to enhance the accuracy of the alignment device, describes several embodiments of th& alignment device which are also applicable to the alignment device in accordance with the present invention. For example, a beam deflection element in the form of, for example a wedge may be arranged between the projection lens system PL and the mask plate MA, which element ensures that the axis of symmetry of the selected alignment beam portions is perpendicular to the mask plate. It is thereby prevented that, due to internal reflections in the mask plate, phase shifts having a detrimental influence on the alignment accuracy occur in the alignment beam.

The invention may not only be used in a device in which a substrate alignment mark is imaged on a mask alignment mark, but also in a device in which the reverse operation is carried out.

Moreover, the invention may be used in a device in which both a mask alignment mark and a substrate alignment mark are each imaged on a reference mark which is present outside the substrate and outside the mask.

This reference mark may be a physical mark, but also an artificial mark in the form of an interference pattern at the location of the substrate alignment mark and the mask alignment mark, which interference pattern is constituted by two interfering beams from the radiation source of the alignment device.

The accuracy with which a substrate alignment mark can be aligned with respect to a mask alignment mark may be enhanced considerably by modulating the output signals of the detectors 13 and 13' in FIGS. 1 and 3 at a fixed frequency. To this end, the mask MA and hence, for example the mask alignment mark $M_2$, can be moved periodically. However, an electro-optical modulation based on switching directions of polarization in combination with a displacement by means of a birefringent element is preferably used.

Instead of an InGaAs-detector also a Si-detector may be used. Such detector has sufficient sensitivity in the range of 1000–1100 nm.

It is also possible to provide a lithographic projection apparatus with a combined alignment device wherein both a conventional alignment beam having a wavelength of, for example 633 nm, and the new alignment beam having a wavelength in the order of 1000–1100 nm are used. Then for undisturbed substrate marks the conventional alignment beam can be used, whereas for asymmetrically disturbed substrate marks the new alignment beam can be used. The combined alignment device has separate radiation sources and separate detectors for the conventional and the new alignment beam, respectively. This device may be a TTL (through the lens PL) alignment device or an off-axis alignment device wherein higher order sub-beams are used which do not pass through the projection lens PL. For supplying the conventional alignment beam with a wavelength of 633 nm a He—Ne laser is used. Instead of such gas laser also a diode laser may be used for supplying the conventional alignment beam. Various diode lasers emitting radiation with a wavelength in the range of 400–800 nm may be used for this purpose.

Figure 6:
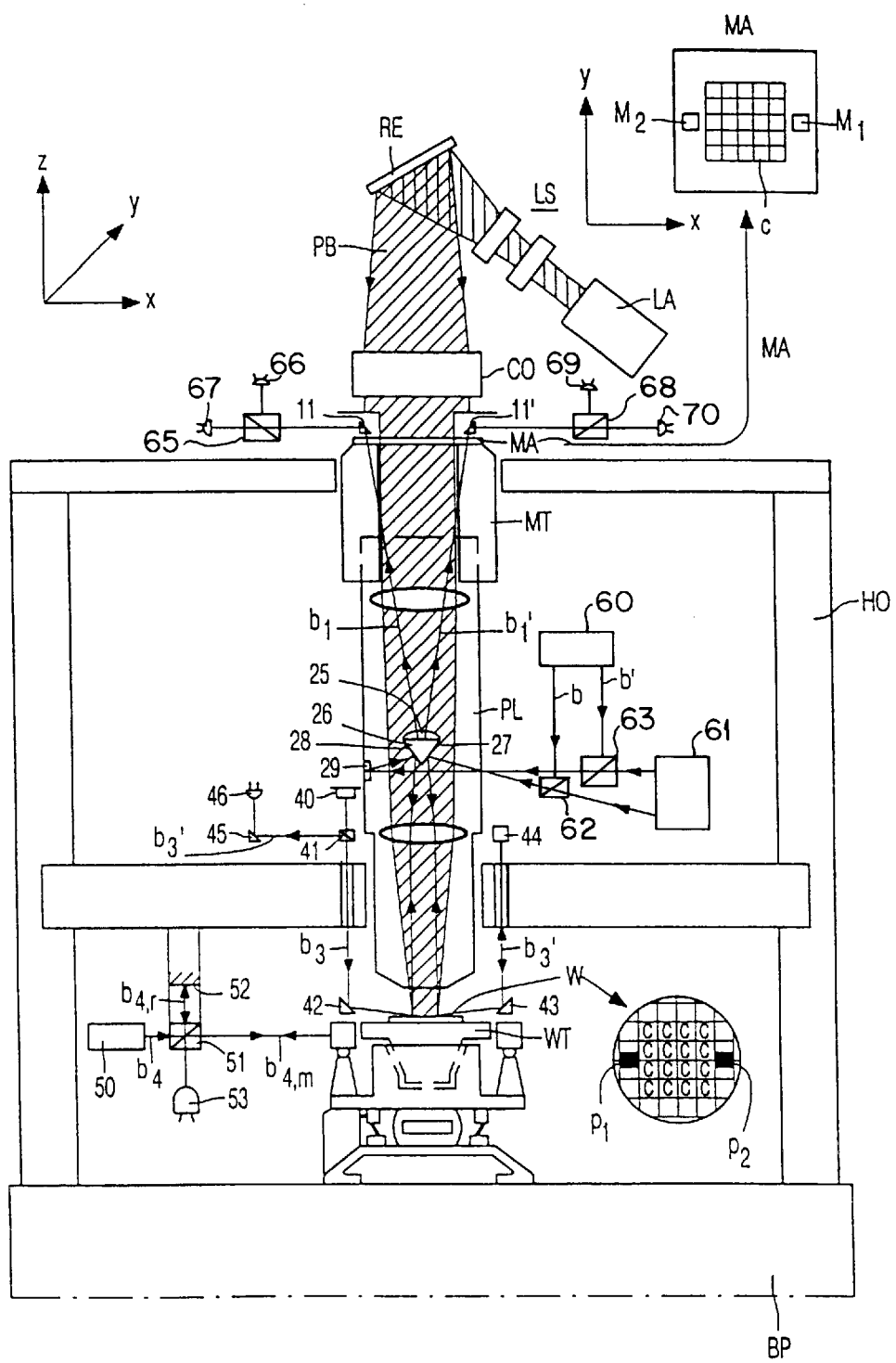
FIG. 6 shows an embodiment of a lithographic apparatus in which two alignment beams are employed.

FIG. 6 shows an embodiment of the combined alignment device. This embodiment has in principle the same construction as the embodiment of FIG. 1, but comprises, instead of one radiation source unit, two such units 60 and 61, one for the new alignment beam and one for the conventional alignment beam. In the paths of these beams a dichroic mirror or prism is arranged which passes the alignment beam from the source unit 61 and reflects the alignment beam from the source unit 60, so that these beam propagate along the same path to and from the alignment mark on the substrate W, through the projection lens PL and to the alignment mark on the mask MA. In the detection branch a dichroic mirror or prism 65 is arranged which reflects one of the alignment beams towards a first detector 66 and passes the other alignment beam towards a second detector 67. In an analogous way as described with reference to FIG. 3 the output of the first detector 66 and of the second detector 67 comprise information about the extent to which the mark M2 coincides with the image of the mark P2 as sensed by one of the alignment beams and by the other of these alignment beams, respectively.

As shown in FIG. 6 the alignment device wherein alignment beams with different wavelength are used may also be a double alignment device. In that case each of the radiation source units 60 and 61 emits two alignment beams, of the same wavelength. A further dichroic mirror or prism 63 is arranged in the path of the additional alignment beams which transmits one of these beams and reflects the other beam, in the same way as the first dichroic prism 62. In the second detection branch of the double alignment device a further dichroic prism or mirror 68 is arranged which reflects one of the two alignment beams, arriving there and having different wavelength, to a detector 69 and transmits the other alignment beam to a detector 70.

The radiation sources 60, 61 may comprise two radiation sources, emitting the same wavelength, or the combination of one radiation source and a beam splitter.

It is also possible to use in a lithographic projection both the above-described TTL, single or double, alignment device with an alignment beam having a wavelength in the order of 1000–1100 nm and an off-axis alignment device. In the latter device sub-beams of higher diffraction orders, for example one or more of the orders 2–7 are used for alignment detection. Alignment detection with higher order sub-beams has the advantage of being less sensitive to asymmetric errors in the substrate alignment marks. When carrying out the alignment detection with higher order sub-beams it is no longer possible to use the TTL method, wherein a mask alignment mark and a substrate alignment mark are imaged onto each other by means of the projection lens, but both the substrate mark and the mask mark should be imaged on a reference mark by means of a radiation beam which does not pass through the projection lens PL.

Figure 7:
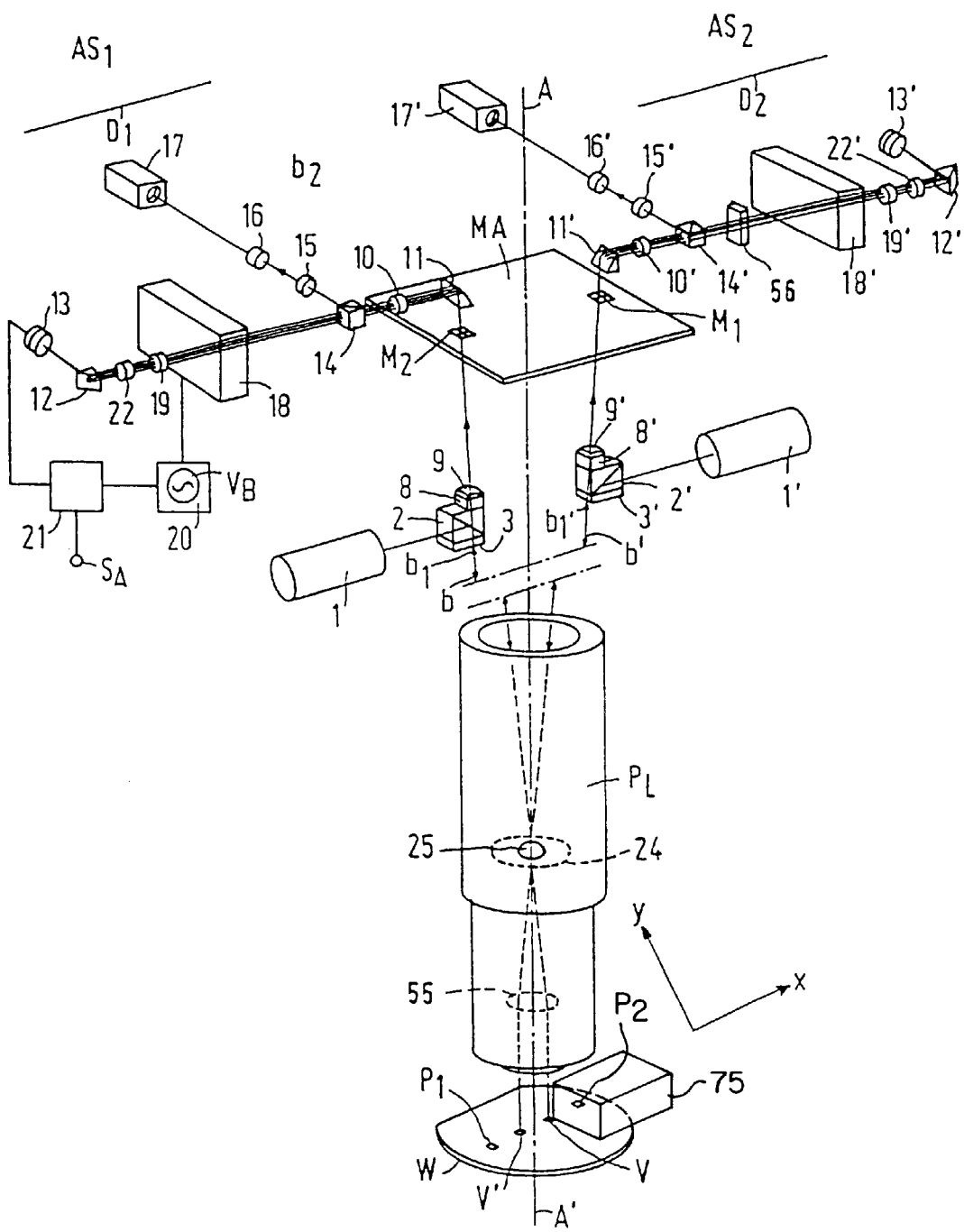
FIG. 7 shows an additional embodiment of a lithographic device in which two alignment devices are employed.
Figure 8:
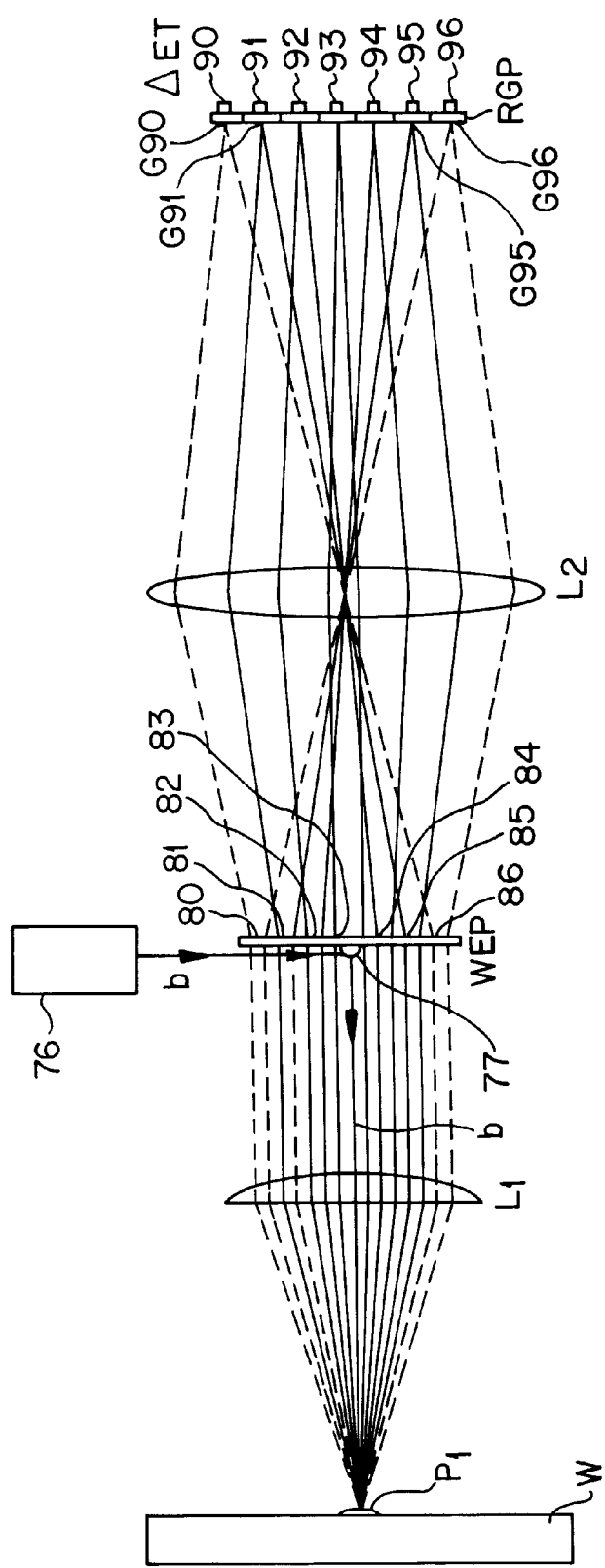
FIG. 8 shows an embodiment of an alignment device employed in the lithographic device of FIG. 7.

FIG. 7 shows the combination of the TTL alignment device and the off-axis device 75 for detecting the extent to which a substrate alignment mark, for example P2, in the form of a diffraction grating, is aligned with respect to a reference grating. An embodiment of the device 75 is shown in FIG. 8. A parallel alignment beam b2, having a wavelength λ, incident on the grating is split up into a number of sub-beams extending at different angles α(not shown) to the normal on the grating, which angles are defined by the known grating formula:

$$\sin \alpha_n = (N\lambda)/p$$

Wherein N is the diffraction order number and p the grating period.

The path of the sub-beams reflected by the grating mark incorporates a lens system L1 which converts the different directions of the sub-beams into different positions un of these sub-beams in a plane 73 according to:

$$un = f1 \, \alpha_n$$

in which f1 is the focal length of the lens system L1.

In this plane means are provided for further separating the different sub-beams.

To this end, a plate may be arranged in this plane, which is provided with deflection elements in the form of, for example wedges. In FIG. 8, the wedge plate is denoted by WEP. The wedges are provided on, for example the rear side of the plate. A prism 77 can then be provided on the front side of the plate, with which an alignment beam coming from the radiation source 76, for example a He—Ne laser can be coupled into the alignment unit. This prism can also prevent the 0-order sub-beam from reaching the detectors. The number of wedges corresponds to the number of sub-beams which is to be used. In the embodiment shown, there are six wedges per dimension for the plus orders so that the sub-beams can be used up to and including the 7-order for the alignment. All the wedges have a different wedge angle so that an optimal separation of the different sub-beams is obtained.

A second lens system L2 is arranged behind the wedge plate. This lens system images the mark P1 in a reference plane where a reference plate RGP is arranged. In the absence of the wedge plate, all sub-beams would be superimposed in the reference plane.

Since the different sub-beams through the wedge plate are deflected at different angles, the images formed by the sub-beams reach different positions in the reference plane. These positions Xn are given by:

$$Xn = f2 \gamma n$$

In which γ is the angle at which a sub-beam is deflected by the wedge plate and f2 is the focal length of the lens system L2.

At these positions, reference gratings G90–G96 are provided. A separate detector 90–96 is arranged behind each of these reference gratings. The output signal of each detector is dependent on the extent to which the images of the substrate grating mark P1 coincides with the relevant reference grating. Hence, the extent of alignment of the substrate grating mark, and thus of the substrate, can be measured with each detector 90–96. However, the accuracy with which the measurement takes place is dependent on the order number of the sub-beam used; as this number is larger, the accuracy is greater. The grating period of each grating is adapted to the order number of the associated sub-beam. As the order number is larger, the grating period is smaller and a smaller alignment error can be detected.

Hitherto only one set of diffraction orders has been considered. As is known, a diffraction grating forms, in additional to +1, +2, +3 etc order sub-beams, also sub-beams of diffraction orders −1, −2, −3 etc. Both the plus orders and the minus orders sub-beams are used to form a grating image, i.e. a first image of the substrate grating mark is formed by the +1 and −1 sub-beams jointly, a second image is formed by the 2 and −2 order sub-beams jointly, and so forth. For the −1 order and −1 order sub-beams no wedges need to be used, but plane-parallel plates which compensate for path-length differences can be provided at the positions of these sub-beams in the plane of the wedge plate. Thus six wedges, both for the plus orders and for the minus orders, are required for the orders 2–7.

In the embodiment of FIG. 8 sub-beams with an order number of 1 to 7 are used so that seven reference gratings G90–G96 are necessary for the alignment in the X-direction. For the alignment in the Y-direction, seven sub-beams may also be used together with seven further reference gratings, not shown in FIG. 7. A second series of twelve wedges, not shown in FIG. 8, is then arranged on the wedge plate WEP, which second series of wedges deflect the sub-beams in the Y-direction. The substrate mark may be the mark shown in FIG. 2. For the first-order sub-beams, a similar reference grating may be used with four grating portions, two of which have a grating period of 8,0 μm, while the other two grating portions have a grating period of 8,8 μm. The other reference gratings have only one grating period which corresponds to the relevant diffraction order of the grating portions with a period of 16 μm of the substrate grating mark P1. The capture range of 44 μm associated with the grating mark P2 of FIG. 2 is then maintained.

The minimum number of diffraction orders which has to be detected to be able to align in a sufficiently accurate way at a given asymmetry of the substrate alignment mark can be determined by means of computer simulations. Such modulations have proved that, for example an alignment error of 150 nm which remains when only a first order sub-beam is used can be reduced to 20 nm when a fifth order sub-beam is used.

In principle, the maximum number of orders which can be detected is determined by the minimum intensity which can still be detected by the detector and by the numerical aperture of the lens system L1, L2.

As is known, the intensity of the sub-beam formed by a diffraction grating quickly decreases with an increase in the order number of this sub-beam; the intensity of the sub-beam is inversely proportional to the square of the order number of this sub5 beam. For a seventh-order sub-beam, the intensity is thus approximately 1/50 of that of a first-order sub-beam. The intensity loss due to reflections undergone by an alignment beam when traversing the off-axis alignment unit is, however, considerably smaller than when it traverses an on-axis alignment unit. In the last-mentioned unit, the alignment beam meets, for example approximately one hundred surfaces on which reflection losses start may occur and in the first mentioned unit it meets, for example only twenty of such surfaces. If the total reflection loss is a factor of four in the off-axis alignment unit, the seventh-order alignment sub-beam may have as much intensity as a first-order alignment beam in the on-axis alignment unit.

For a more detailed description and other embodiments of the off-axis alignment device, reference is made to the PCT application WO 98/39689 in which such device is described.

The invention has been elucidated with reference to an optical lithographic apparatus, but it is not limited thereto. The invention may also be used in a lithographic apparatus in which the projection beam is a charged-particle beam such as an electron beam, an ion beam or an X-ray beam. These lithographic apparatuses may not only be used for manufacturing integrated circuits but also for manufacturing, for example liquid crystalline display panels, magnetic heads, or integrated planar optical systems.

What is claimed is:

1. An alignment device constructed and arranged to align a first object which is provided with at least one first alignment mark, with respect to a second object which is provided with at least one second alignment mark, said alignment device comprising:

a radiation source constructed and arranged to supply an alignment beam irradiating one of said first and second alignment marks, a first object holder constructed and arranged to hold said first object, a second object holder constructed and arranged to hold said second object, an alignment imaging system arranged between said first alignment mark and said second alignment mark, said alignment imaging system imaging one of said first and second alignment marks onto the other alignment mark by the alignment beam for a purpose of alignment control, and a detection system sensitive to the alignment beam radiation and arranged in the path of alignment beam radiation coming from said other alignment mark, said detection system converting alignment radiation into an electrical output signal, wherein the first and second alignment marks are periodic structures which deflect the alignment beam into several diffraction orders sub-beams, the detection system detecting only selected sub-beams and the output signal of the detection system being indicative of the extent to which the first and second object are aligned with respect to each other, wherein the wavelength of the alignment beam is between about 980 nm and 1100 nm.

2. An alignment device as claimed in claim 1, wherein the radiation source is a laser selected from the group of lasers consisting of an Nd:YAG laser having a wavelength of 1064 nm;
an Nd:YLF laser having a wavelength of 1047 nm; and
a semiconductor laser having a wavelength of 980 nm.

3. An alignment device as claimed in claim 1, wherein the detection system comprises an InGaAs detector.

4. A lithographic apparatus constructed and arranged to image a mask pattern, present in a mask plate provided with at least a first alignment mark, on a substrate provided with at least a second alignment mark, said lithographic apparatus comprising:

an illumination unit constructed and arranged to illuminate the mask pattern with a projection beam, a mask plate holder constructed and arranged to hold the mask plate, a substrate holder constructed and arranged to hold the substrate, a projection system arranged between the mask plate holder and the substrate holder, said projection system projecting the mask pattern on the substrates; and an alignment device constructed and arranged to align the mask plate and the substrate with respect to each other, wherein the alignment device is constructed and arranged to align a first object which is provided with at least one first alignment mark, with respect to a second object which is provided with at least one second alignment mark, said alignment device comprising:

a radiation source constructed and arranged to supply an alignment beam irradiating one of said first and second alignment marks, a first object holder constructed and arranged to hold said first object, a second object holder constructed and arranged to hold said second object, an alignment imaging system arranged between said first alignment mark and said second alignment mark, said alignment imaging system imaging one of said first and second alignment marks onto the other alignment mark by the alignment beam for a purpose of alignment control, and a detection system sensitive to the alignment beam radiation and arranged in the path of alignment beam radiation coming from said other alignment mark, said detection system converting alignment radiation into an electrical output signal, p2 wherein the first and second alignment marks are periodic structures which deflect the alignment beam into several diffraction orders sub-beams, the detection system detecting only selected sub-beams and the output signal of the detection system being indicative of the extent to which the first and second object are aligned with respect to each other, wherein the wavelength of the alignment beam is between about 980 nm and 1100 nm, wherein the substrate constitutes the first object and the mask plate constitutes the second object.

5. A lithographic apparatus as claimed in claim 4, wherein the projection beam is a beam of electromagnetic radiation, the projection system is an optical projection system, and the imaging system of the alignment device also comprises the optical projection system.

6. A lithographic apparatus of claim 4, wherein one of said alignment marks is reflective to a portion of the alignment beam and a correction element, constructed and arranged to correct the direction and convergence of said reflected alignment beam portion, is arranged between the substrate holder and the mask holder, in said alignment beam portion, said correction element having a dimension which is considerably smaller than the diameter of said alignment beam portion on the plane of said correction element.

7. A lithographic apparatus as claimed in claim 4, wherein an order diaphragm, provided with radiation-transmissive portions which transmit only alignment beam portions to a second alignment mark diffracted by a first alignment mark in the first order, is provided in the alignment beam between the mask holder and the substrate holder.

8. A lithographic apparatus as claimed in claim 4, wherein a radiation deflection element is arranged in the vicinity of a mask alignment mark constructed and arranged to direct the axis of symmetry of selected alignment beam portions principally perpendicularly to the plane of the mask plate, said radiation deflection element being considerably smaller than the cross-section of the projection beam at the position of said plate.

9. A lithographic apparatus as claimed in claim 4, further comprising an additional alignment device constructed and arranged to align an additional mask alignment mark with respect to an additional substrate alignment mark.

10. A lithographic apparatus as claimed in claim 4, wherein said first alignment mark is a substrate alignment mark and said second alignment mark is a mask alignment mark.

11. A lithographic apparatus as claimed in claim 4, wherein said first alignment mark is a mask alignment mark and said second alignment mark is a substrate alignment mark.

12. A lithographic apparatus as claimed in claim 4, wherein the second alignment mark is a reference alignment mark which is located outside the substrate and outside the mask, and both a substrate alignment mark and a mask alignment mark constitute first alignment marks which are each imaged onto the reference alignment mark.

13. A lithographic apparatus as claimed in claim 4, wherein the radiation source of the alignment device supplies two radiation beams which form an interference pattern in the plane of a substrate alignment mark and in the plane of a mask alignment mark, the first alignment mark is constituted by the interference pattern, and both the substrate alignment mark and the mask alignment mask are second alignment marks.

14. A lithographic apparatus as claimed in claim 4, further comprising a displacing unit controlled by periodical signals arranged in the radiation path of an alignment beam, said displacing unit periodically displacing with respect to each other a second alignment mark and the image on said mark of a first alignment mark observed by the detection system.

15. An alignment device constructed and arranged to align a first object which is provided with at least one first alignment mark, with respect to a second object which is provided with at least one second alignment mark, said alignment device comprising:
  a radiation source constructed and arranged to supply an alignment beam irradiating one of said first and second alignment marks,
  a first object holder constructed and arranged to hold said first object,
  a second object holder constructed and arranged to hold said second object,
  an alignment imaging system arranged between said first alignment mark and said second alignment mark, said alignment imaging system imaging one of said first and second alignment marks onto the other alignment mark by the alignment beam for a purpose of alignment control, and
  a detection system sensitive to the alignment beam radiation and arranged in the path of alignment beam radiation coming from said other alignment mark, said detection system converting alignment radiation into an electrical output signal,
  wherein the first and second alignment marks are periodic structures which deflect the alignment beam into several diffraction orders sub-beams, the detection system detecting only selected sub-beams and the output signal of the detection system being indicative of the extent to which the first and second object are aligned with respect to each other, wherein the wavelength of the alignment beam is between about 980 nm and 1100 nm, and
  wherein the detection system comprises a Si-detector.

16. A lithographic apparatus constructed and arranged to image a mask pattern, present in a mask plate provided with at least a first alignment mark, on a substrate provided with at least a second alignment mark, said lithographic apparatus comprising;
  an illumination unit constructed and arranged to illuminate the mask pattern with a projection beam,
  a mask plate holder constructed and arranged to hold the mask plate,
  a substrate holder constructed and arranged to hold the substrate,
  a projection system arranged between the mask plate holder and the substrate holder, said projection system projecting the mask pattern on the substrate; and
  an alignment device constructed and arranged to align the mask plate and the substrate with respect to each other,
  wherein the alignment device is constructed and arranged to align a first object which is provided with at least one first alignment mark, with respect to a second object which is provided with at least one second alignment mark, said alignment device comprising:
    a radiation source constructed and arranged to supply an alignment beam irradiating one of said first and second alignment marks,
    a first object holder constructed and arranged to hold said first object,
    a second object holder constructed and arranged to hold said second object,
    an alignment imaging system arranged between said first alignment mark and said second alignment mark, said alignment imaging system imaging one of said first and second alignment marks onto the other alignment mark by the alignment beam for a purpose of alignment control, and
    a detection system sensitive to the alignment beam radiation and arranged in the path of alignment beam radiation coming from said other alignment mark, said detection system converting alignment radiation into an electrical output signal,
    wherein the first and second alignment marks are periodic structures which deflect the alignment beam into several diffraction orders sub-beams, the detection system detecting only selected sub-beams and the output signal of the detection system being indicative of the extent to which the first and second object are aligned with respect to each other, wherein the wavelength of the alignment beam is between about 980 nm and 1100 nm,
  wherein the substrate constitutes the first object and the mask plate constitutes the second object,
  further comprising a second, off-axis, alignment device constructed and arranged to align a diffracting substrate alignment mark with respect to a reference, which second alignment device is adapted to separately detect a number of sub-beams diffracted by the substrate mark in different diffraction orders higher than 0, each sub-beam comprising an indication about the position of the substrate mark with respect to the reference.

17. An alignment device constructed and arranged to align a first object which is provided with at least one first alignment mark, with respect to a second object which is provided with at least one second alignment mark, said alignment device comprising:
  a radiation source constructed and arranged to supply an alignment beam irradiating one of said first and second alignment marks,
  a first object holder constructed and arranged to hold said first object, a second object holder constructed and arranged to hold said second object, an alignment imaging system arranged between said first alignment mark and said second alignment mark, said alignment imaging system imaging one of said first and second alignment marks onto the other alignment mark by the alignment beam for a purpose of alignment control, a detection system sensitive to the alignment beam radiation and arranged in the path of alignment beam radiation coming from said other alignment mark, said detection system converting alignment radiation into an electrical output signal, and wherein the first and second alignment marks are periodic structures which deflect the alignment beam into several diffraction orders sub-beams, the detection system detecting only selected sub-beams and the output signal of the detection system being indicative of the extent to which the first and second object are aligned with respect to each other, wherein the wavelength of the alignment beam is between about 980 nm and 1100 nm, and further comprising a second radiation source constructed and arranged to supply a second alignment beam having a wavelength substantially smaller than 1000 nm, which beam interacts with said first and second alignment marks in the same way as the beam with the wavelength of between about 980 and 1100 nm, and a second radiation-sensitive detection system arranged in the path of selected beam portions of the second alignment beam coming from a first alignment mark and a second alignment mark onto which the first alignment mark is imaged, the output of the second detection system being indicative of the extent to which the first and second object are aligned with respect to each other.

* * * * *